United States Patent
Monoi

(10) Patent No.: US 7,116,369 B1
(45) Date of Patent: Oct. 3, 2006

(54) CHARGE COUPLE DEVICE

(75) Inventor: Makoto Monoi, Tokyo-To (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/497,154

(22) Filed: Feb. 3, 2000

(30) Foreign Application Priority Data

Feb. 3, 1999 (JP) .................................. 11-026482

(51) Int. Cl.
H04N 5/335 (2006.01)

(52) U.S. Cl. ..................................................... 348/311

(58) Field of Classification Search ................ 348/294, 348/302, 303, 304, 311, 323, 324, 315, 322; 257/232, 233
See application file for complete search history.

(56) References Cited

U.S. PATENT DOCUMENTS

| | | | | |
|---|---|---|---|---|
| 4,696,021 A | * | 9/1987 | Kawahara et al. ............ 377/58 |
| 5,028,970 A | * | 7/1991 | Masatoshi .................... 257/53 |
| 5,250,825 A | * | 10/1993 | Negishi et al. ............. 257/232 |
| 5,442,396 A | * | 8/1995 | Nakashiba ................... 348/322 |
| 5,504,355 A | * | 4/1996 | Hatano ........................ 257/225 |
| 5,506,429 A | * | 4/1996 | Tanaka et al. ............... 257/233 |
| 5,736,756 A | * | 4/1998 | Wakayama et al. ......... 257/223 |

* cited by examiner

*Primary Examiner*—Tuan Ho
*Assistant Examiner*—Timothy J. Henn
(74) *Attorney, Agent, or Firm*—Oblon, Spivak, McClelland, Maier & Neustadt, P.C.

(57) ABSTRACT

A solid image pickup apparatus includes: a pixel string in which a plurality of photoelectric converting sections corresponding to pixels are arranged in one string; a CCD register, adjacently arranged to the pixel string, for successively transferring in a predetermined direction, signal charges photoelectrically converted in the respective photoelectric converting sections; a transfer electrode for supplying a voltage for transferring to the CCD register; n pieces of wiring layers formed in lamellar shape above the transfer electrode and its periphery via an insulating layer; and a contact having a longest length along an electric charge transfer direction of the CCD register to at least one location between the transfer electrode and the wiring layer and between two wiring layers vertically adjacent to each other via the insulating layer.

25 Claims, 9 Drawing Sheets

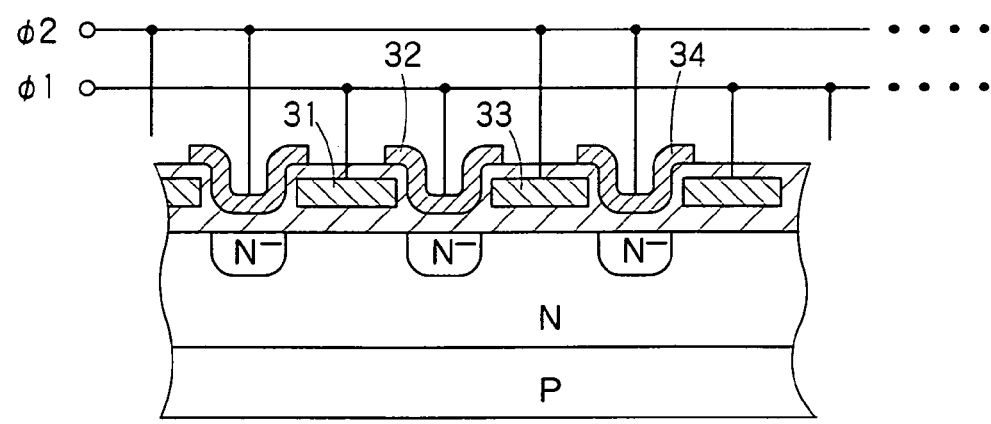
F I G. 6

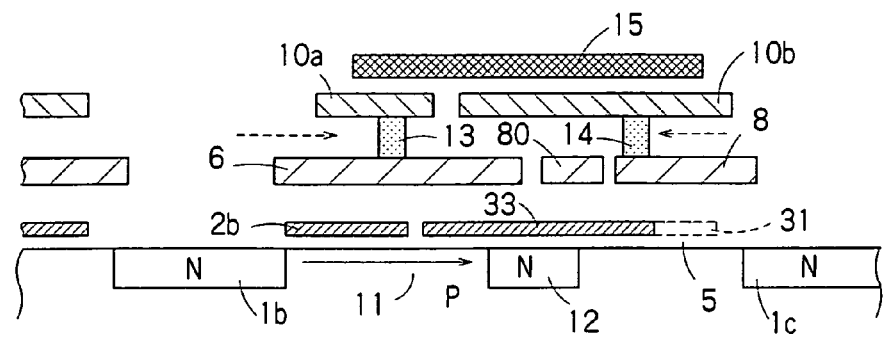
F I G. 9A
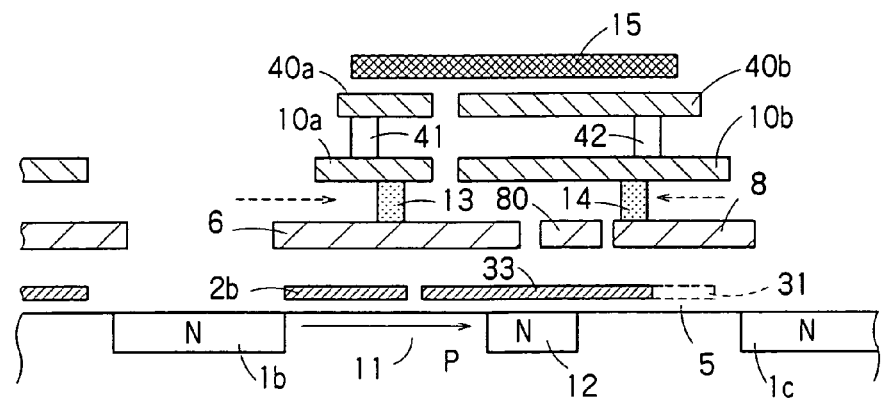
F I G. 9B

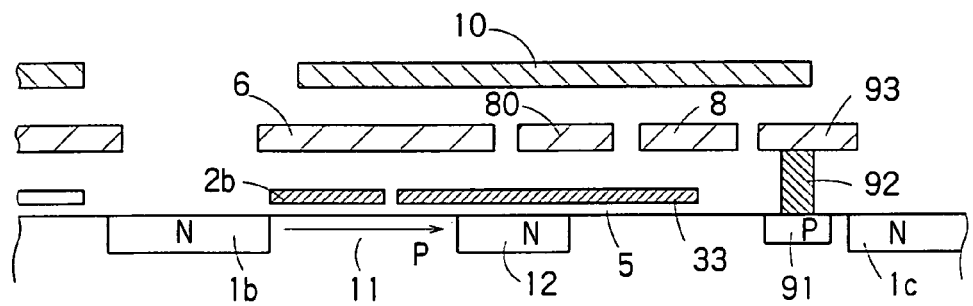
F I G. 12
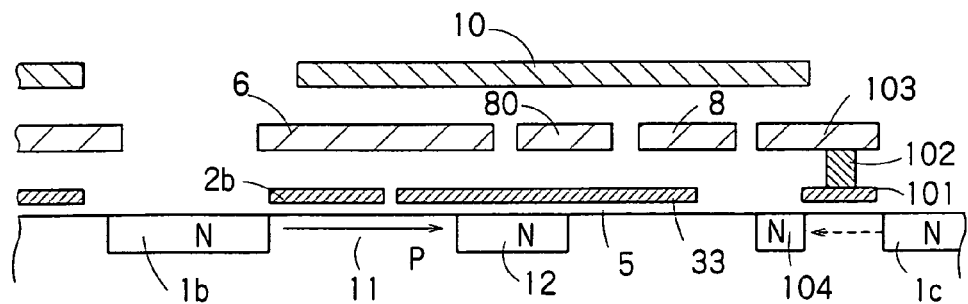
F I G. 13

CHARGE COUPLE DEVICE

BACKGROUND OF THE INVENTION

1. Field of the Invention

The present invention relates to a solid image pickup apparatus having a pixel string in which photoelectric converting sections such as photo diodes are linearly arranged, and more particularly, it relates to the layout configuration of the solid image pickup apparatus.

2. Related Background Art

A CCD linear image sensor for use in an image reader such as a scanner is provided with photoelectric converting sections consisted of photo diodes and the like arranged in strings, and a CCD register. A signal charge photoelectrically converted by each photoelectric converting section is successively transferred to an output section through the CCD register.

Moreover, a color CCD linear image sensor in which three linear sensors are arranged in parallel and reads out different color images, respectively is broadly used in a color reader such as a color scanner.

FIG. 1 is a plan view of a conventional CCD color linear image sensor, and FIG. 2 is an enlarged view showing the constitution in the periphery of the end of a pixel string 1$b$ disposed in the middle of FIG. 1. The image sensor of FIG. 1 is provided with pixel strings 1$a$, 1$b$, 1$c$ in which a plurality of photosensitive pixels are arranged in three strings, and color filters (not shown) of red, green, blue and the like are formed on each of the pixel strings 1$a$, 1$b$, 1$c$. The signal charges photoelectrically converted in the respective pixel strings are transferred to CCD registers 3$a$, 3$b$, 3$c$ via shift electrodes 2$a$, 2$b$, 2$c$, and they successively move in the CCD registers 3$a$, 3$b$, 3$c$ along the arrow directions of FIG. 1. The electric charges reaching the ends of the CCD registers 3$a$, 3$b$, 3$c$ are transferred to output circuits 4$a$, 4$b$, 4$c$. The output circuits 4$a$, 4$b$, 4$c$ are disposed corresponding to the respective pixel strings 1$a$, 1$b$, 1$c$, and for example, color image signals for RGB are outputted from the output circuits 4$a$, 4$b$, 4$c$.

In the conventional image sensor shown in FIG. 1, the narrower the distance between the pixel strings becomes, the more the unevenness of resolution is reduced, so that it is possible to simplify the configuration of an optical system for focusing an object light on the light receiving surface of the photo diodes constituting the pixel strings, and the structure of a scanning mechanism system for allowing the image sensor to scan. Therefore, in recent years, the image sensor in which the distance between the pixel strings is narrowed has been vigorously developed.

However, when the distance between the pixel strings is narrowed, the distances between the pixel strings 1$a$, 1$b$, 1$c$ and the CCD registers 3$a$, 3$b$, 3$c$ are narrowed, so that the amount of a light which leaks from the light receiving surfaces of the respective pixel strings 1$a$, 1$b$, 1$c$ to the CCD registers 3$a$, 3$b$, 3$c$ increases. Accordingly, there is a problem that owing to the leaked light, excessive electric charges are generated in the CCD registers 3$a$, 3$b$, 3$c$.

FIG. 3 is a sectional view along the line A—A of FIG. 2. As shown in FIG. 3, a polysilicon layer is formed on a semiconductor substrate via an insulating film 5, and the polysilicon layer is used to form the shift electrodes 2$a$, 2$b$, 2$c$ and transfer electrodes 31 to 34 of the CCD registers 3$a$, 3$b$, 3$c$.

A wiring layer 6 formed of a conductive material such as aluminum is connected to the shift electrodes 2$a$, 2$b$, 2$c$ via a contact 7, and voltages for transferring the signal charges are supplied to the shift electrodes 2$a$, 2$b$, 2$c$ via the wiring layer 6.

Wiring layers 8, 80 formed of a conductive material such as aluminum are connected to the transfer electrodes 31 to 34 of the CCD registers 3$a$, 3$b$, 3$c$ via a contact 9, and voltages for the transfer of the signal charge are supplied from the wiring layers 8, 80 to the CCD registers 3$a$, 3$b$, 3$c$.

Furthermore, a wiring layer 10 of aluminum is disposed on each of the CCD registers 3$a$, 3$b$, 3$c$, so that no external light enters through the gaps of the wiring layers 6, 8, 80.

The signal charges generated in the pixel strings 1$a$, 1$b$, 1$c$ are transferred to the CCD registers 3$a$, 3$b$, 3$c$ via the shift electrodes 2$a$, 2$b$, 2$c$, and then, they is transferred in the CCD registers 3$a$, 3$b$, 3$c$ along the arrow directions of FIG. 2.

However, in the conventional image sensor, the external light passes through paths shown by the dotted arrows of FIG. 3 and enters a channel area 11 under the shift electrodes 2$a$, 2$b$, 2$c$ and an electric charge transfer area 12 of the CCD registers 3$a$, 3$b$, 3$c$, and there is a fear that an S/N ratio is deteriorated.

SUMMARY OF THE INVENTION

The present invention has been developed in consideration of this respect, and an object thereof is to provide a solid image pickup apparatus in which an external light is prevented from entering a CCD register or a shift electrode.

To achieve the above-described object, according to the present invention, there is provided a solid image pickup apparatus comprising:

a pixel string in which a plurality of photoelectric converting sections corresponding to pixels are arranged in one string;

a CCD register, adjacently arranged to said pixel string, for successively transferring, in a predetermined direction, signal charges photoelectrically converted in the respective photoelectric converting sections;

a wiring layer formed above the CCD register and its periphery via an insulating layer; and a contact formed in a strip shape along an electric charge transfer direction of the CCD register and connected to the wiring layer.

According to the present invention, the contact is formed in a groove shape along the electric charge transfer direction of the CCD register, and a transfer electrode is connected to a first wiring layer via this contact. Because of this, the external light can be cut off by a filler conductive material filled in the contact, and no external light enters the electric charge transfer area of the CCD register, thereby improving S/N ratio of the solid image pickup apparatus.

Moreover, according to the present invention, a contact hole is formed in a groove shape along a direction crossing substantially at right angles to an electric charge transfer direction under the shift electrode, and the shift electrode is connected to a second wiring layer via this contact. Because of this, the external light can be cut off by the conductive material filled in the contact, and no external light enters a channel area under the shift electrode or the electric charge transfer area of the CCD register, thereby improving electric properties of pickup apparatus.

Moreover, according to the present invention, there is provided a solid image pickup apparatus comprising:

a pixel string in which a plurality of photoelectric converting sections corresponding to pixels are arranged in one string;

a CCD register, adjacently arranged to said pixel string, for successively transferring, in a predetermined direction, signal charges photoelectrically converted in the respective photoelectric converting sections;

a transfer electrode for supplying a voltage for transferring electric charge to the CCD register;

n (n is an integer of two or more) wiring layers formed in the form of upper and lower layers above the transfer electrode via an insulating layer; and a contact formed in a strip shape along an electric charge transfer direction of the CCD register in at least one place between the transfer electrode and the wiring layer and between two wiring layers vertically adjacent to each other via the insulating layer.

Furthermore, according to the present invention, there is provided a solid image pickup apparatus comprising:

a pixel string in which a plurality of photoelectric converting sections corresponding to pixels are arranged in one string;

a CCD register, adjacently arranged to said pixel string, for successively transferring, in a predetermined direction, signal charges photoelectrically converted in the respective photoelectric converting sections;

n (n is an integer of two or more) wiring layers formed in the form of upper and lower layers above the CCD register and its periphery via an insulating layer; and a contact formed in a strip shape along an electric charge transfer direction of the CCD register in at least one place between two wiring layers vertically adjacent to each other via the insulating layer.

BRIEF DESCRIPTION OF THE DRAWINGS

FIG. 6 is a sectional view along line B—B of FIG. 4.

FIGS. 9A and 9B are a sectional view of a modification example along line A'—A' of FIG. 7.

FIG. 12 is a sectional view showing an example in which a predetermined voltage is applied to a diffusion area between the pixel string and the CCD register.

FIG. 13 is a sectional view showing an example in which an electric discharge gate is disposed for discharging the electric charge of the pixel string.

DETAILED DESCRIPTION OF THE PREFERRED EMBODIMENTS

A solid image pickup apparatus of the present invention will specifically be described hereinafter with reference to the drawings. In the following, as one example of the solid image pickup apparatus, a CCD color linear image sensor (hereinafter referred to simply as the image sensor) will be described in which linear pixel strings corresponding to red, green, and blue colors are closely arranged.

First Embodiment

Figure 1:
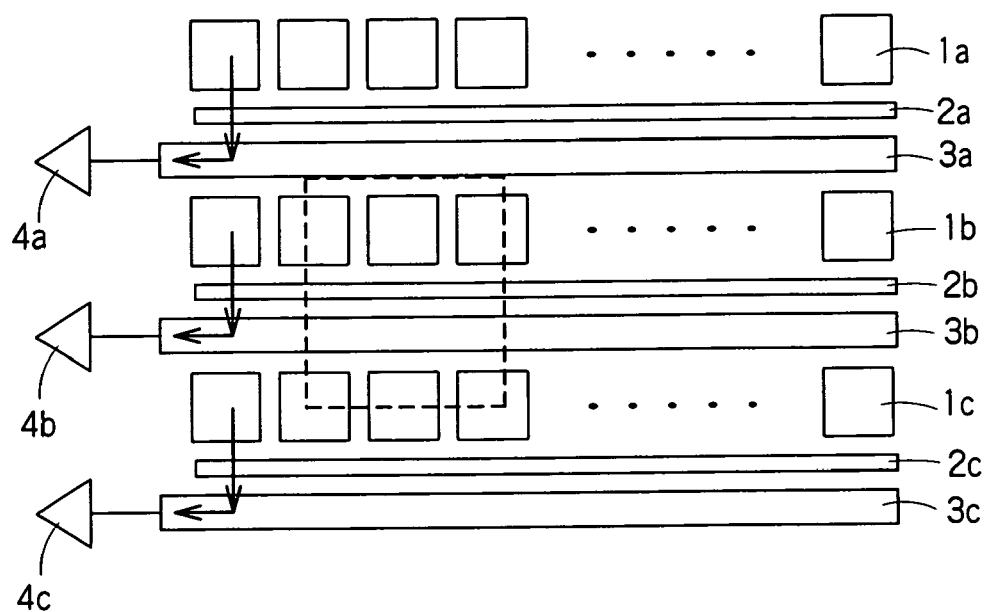
FIG. 1 is a plan view of a conventional CCD color linear image sensor.

The image sensor of the present embodiment is, similarly to FIG. 1, provided with pixel strings 1a, 1b, 1c, shift electrodes 2a, 2b, 2c, CCD registers 3a, 3b, 3c, and output circuits 4a, 4b, 4c arranged parallel in three strings.

The pixel strings 1a, 1b, 1c have a plurality of photo diodes corresponding to pixels, which are arranged in one string, respectively (e.g., 2000 to 10000 diodes). Color filters (not shown) are attached to the top surface of the pixel string. Additionally, although omitted in FIG. 4, three pixel strings corresponding to red, green, and blue colors, respectively, are actually arranged in parallel.

Figure 2:
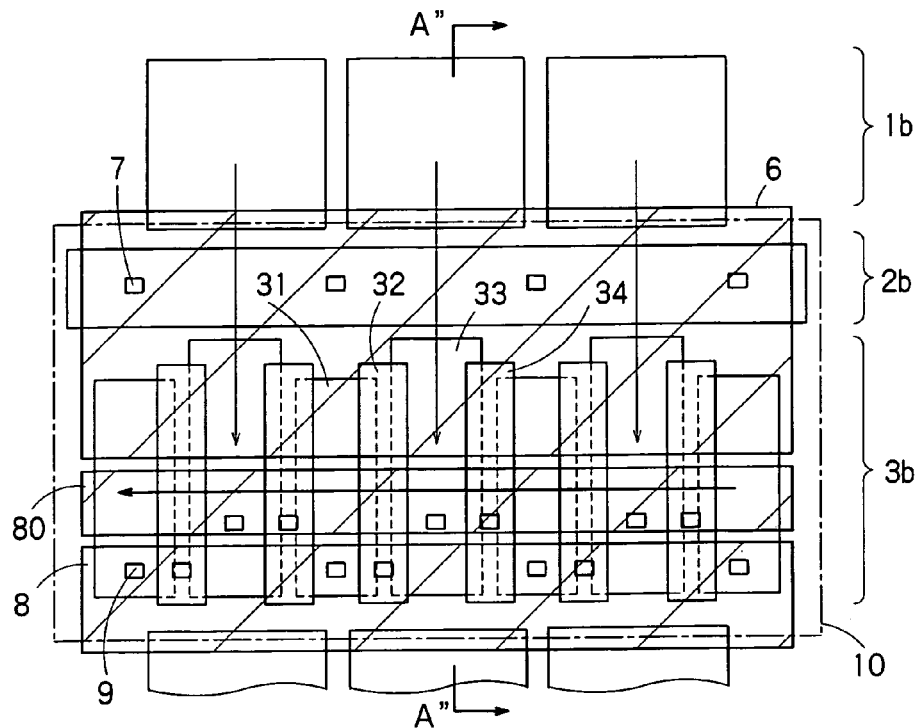
FIG. 2 is an enlarged view showing the constitution in the vicinity of the end of a pixel string disposed in the middle of FIG. 1.
Figure 3:
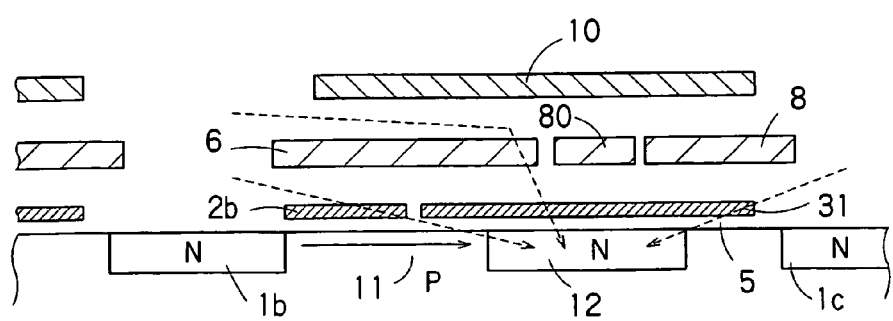
FIG. 3 is a sectional view taken along line A—A of FIG. 2.
Figure 4:
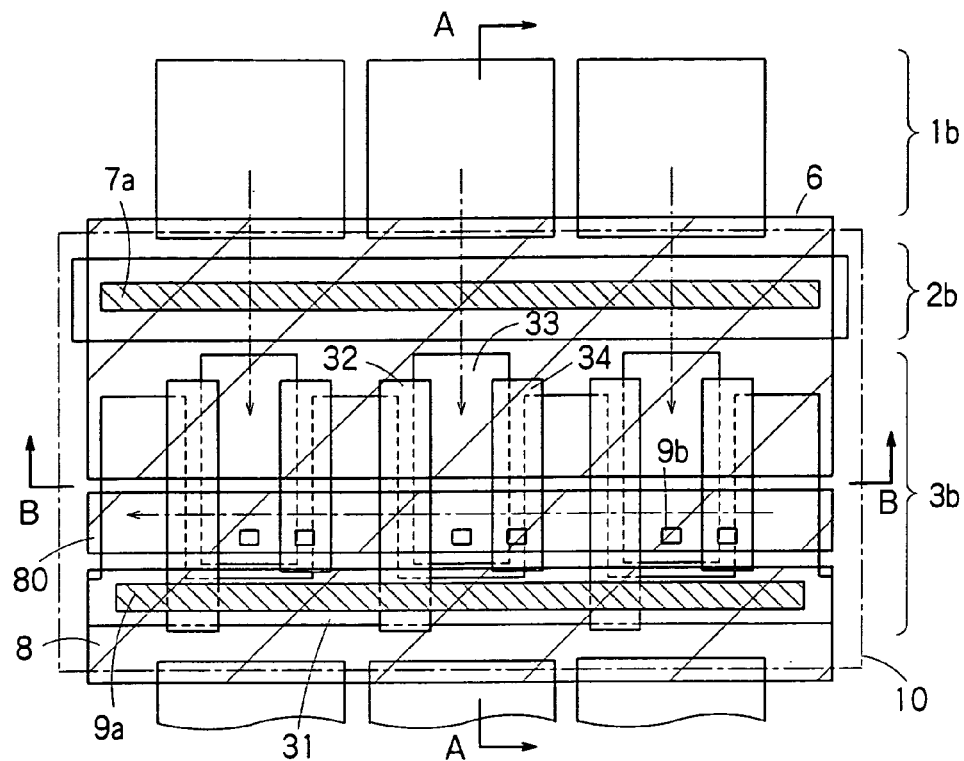
FIG. 4 is a plan view of a first embodiment of the image sensor.
Figure 5:
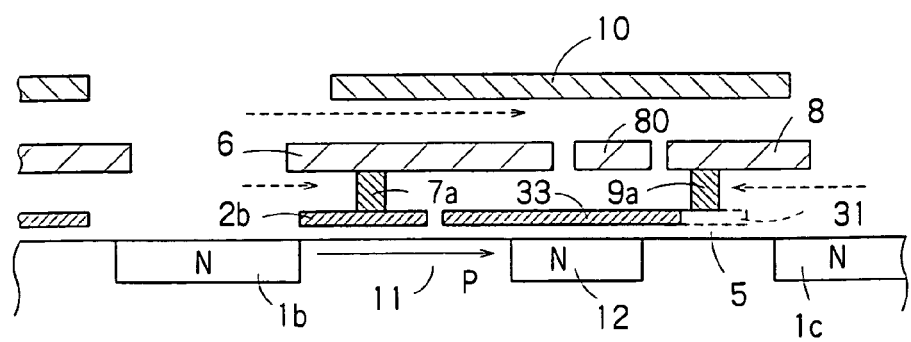
FIG. 5 is a sectional view along line A—A of FIG. 4.

FIG. 4 is a plan view of a first embodiment of the image sensor, and corresponds to a part surrounded by a dotted line of FIG. 1. Moreover, FIG. 5 is a sectional view along line A—A of FIG. 4, and FIG. 6 is a sectional view along line B—B of FIG. 4. In FIGS. 4 to 6, the constituting parts common to those of FIGS. 2 and 3 are denoted with the same numerals.

The signal charge photoelectrically converted in the pixel string 1b is passed through the channel area 11 under the shift electrode 2b, and transferred to the electric charge transfer area 12 in the CCD register 3b. The CCD register 3b successively transfers the signal charge from the shift electrode 2b along the arrow direction of FIG. 4. The output terminal of the CCD register 3b is connected to the output circuit 4b (FIG. 1) for converting the transferred electric charge to an output signal.

As shown in FIGS. 4 to 6, the CCD register 3b includes a plurality of transfer electrodes 31 to 34 arranged in one string, and the electric charge transfer area 12 formed under the transfer electrodes 31 to 34. As shown in FIG. 6, a voltage $\phi 1$ is applied to the adjacent transfer electrodes 31, 32, and a voltage $\phi 2$ is applied to further two adjacent transfer electrodes 33, 34.

As shown by slant lines in FIG. 4, a groove-shaped contact hole 9a extended along the electric charge transfer direction (the longitudinal direction of the CCD register) is formed on the top surfaces of the transfer electrodes 31, 32, and this contact hole 9a is filled with conductive materials such as aluminum to form a first contact. As shown in FIG. 5, the transfer electrodes 31, 32 are connected to the upper wiring layer (first wiring layer) 8 via the conductive material in the contact hole 9a.

Moreover, contact holes 9b are formed at predetermined intervals on the top surfaces of the transfer electrodes 33, 34 adjacent to the transfer electrodes 31, 32, and the transfer electrodes 33, 34 are connected to the wiring layer 80 (fifth wiring layer) via the contact holes 9b. The contact hole 9b is filled with the conductive materials such as aluminum to form a fifth contact.

As shown in FIG. 4, the transfer electrode 31 is formed like a comb, and the transfer electrodes 31 and 32 formed adjacent to each other are connected to the contact hole 9a. Moreover, each transfer electrode 33 is formed between the comb teeth of the transfer electrode 31.

On the other hand, as shown by slant lines in FIG. 4, formed on the top surface of the shift electrode 2b is a groove-shaped contact hole 7a extended along the longitudinal direction (a direction crossing substantially at right angles to an electric charge transfer direction in the channel area 11) of the shift electrode 2b. The shift electrode 2b is connected to the wiring layer (second wiring layer) 6 via the contact hole 7a. The contact hole 7a is filled with the conductive materials such as aluminum to form a second contact.

Moreover, a wiring layer 10 is formed on the top surfaces of the wiring layers 6, 8, 80 via the insulating layer so that no external light enters via the wiring layers 6, 8, 80.

As described above, in the present embodiment, since the groove-shaped contact holes 7a, 9a extended in the longitudinal direction are formed on the top surface of shift electrode 2b and the top surfaces of transfer electrodes 31, 32 of CCD register 3b, the external light can be cut off by the conductive materials filled in the contact holes 7a, 9a. Therefore, as shown in FIG. 5, the external light incident between the wiring layer 6 and the shift electrode 2b, and the external light incident between the wiring layer 8 and the transfer electrodes 31 to 34 can be cut off, and no external light enters the electric charge transfer area 12 of the CCD register 3b, thereby improving the S/N ratio of the channel area 11 under the shift electrode 2b.

Moreover, the structure of the present embodiment is the same as that of the conventional image sensor except that the contact holes 7a, 9a are formed in the groove shapes, and the contact holes 7a, 9a can be formed in the conventional contact hole forming process, so that the change of the manufacture process is minimized, and there is no possibility that a manufacture cost increase.

Additionally, the contact holes 7a, 9a do not need to have the continuous groove shapes, and may be discontinued in some portions. In this case, however, a total length sum of the contact hole 9a preferably is equal to or more than the half of the entire extension of the longitudinal direction (electric charge transfer direction) of the CCD register 3b, and a total length sum of the contact hole 7a preferably is equal to or more than the half of the entire extension of the longitudinal direction (a direction crossing substantially at right angles to an electric charge transfer direction) of the shift electrode 2b.

Second Embodiment

A second embodiment has a feature in which the external light is entered less than the first embodiment.

Figure 7:
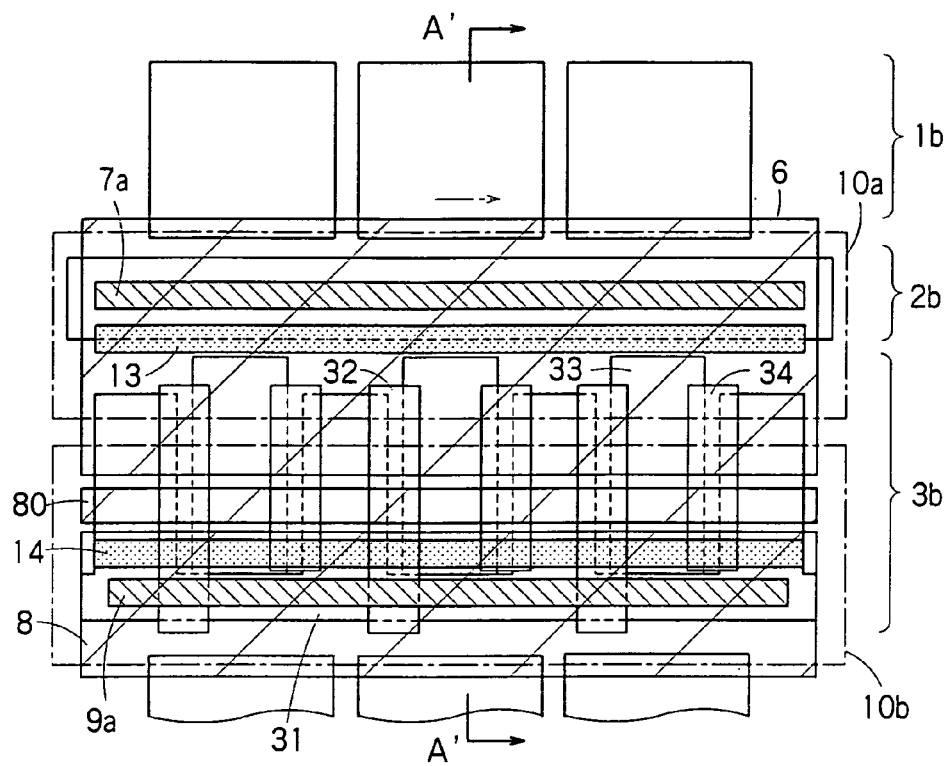
FIG. 7 is a plan view of a second embodiment of the image sensor.
Figure 8:
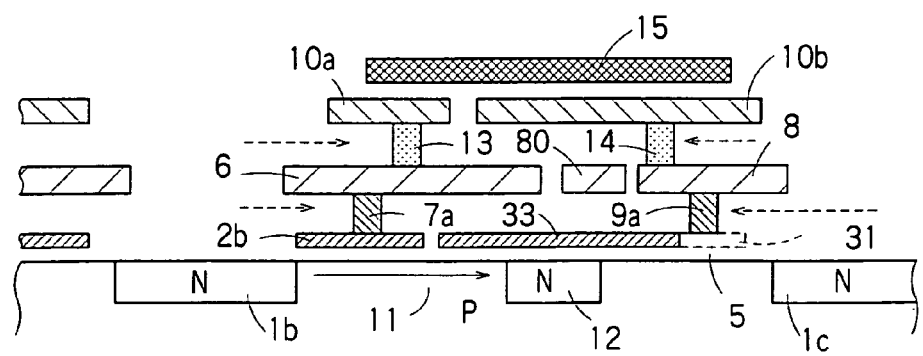
FIG. 8 is a sectional view along line A'—A' of FIG. 7.

FIG. 7 is a plan view of the second embodiment of the image sensor, and FIG. 8 is a sectional view along line A'—A' of FIG. 7. In FIGS. 7 and 8, the constituting parts common to those of FIGS. 4 and 5 are denoted with the same numerals.

In the image sensor of FIG. 7, similarly to FIG. 4, the shift electrode 2b and the wiring layer 6 are connected via the groove-shaped contact hole 7a, and the transfer electrodes 31, 32 of CCD register 3b and the wiring layer 8 are connected via the groove-shaped contact hole 9a.

Additionally, in the image sensor of FIG. 7, a wiring layer (fourth wiring layer) 10a formed above the wiring layer 6 is connected to the wiring layer 6 via a groove-shaped contact hole 13 extended along the longitudinal direction of the shift electrode 2b, and a wiring layer (third wiring layer) 10b formed above the wiring layer 8 is connected to the wiring layer 8 via a groove-shaped contact hole 14 extended along the longitudinal direction (electric charge transfer direction) of the CCD register 3b. These contact holes 13, 14 are filled with the conductive materials such as aluminum, and fourth and third contacts are formed, respectively.

These wiring layers 10a, 10b are formed separately from each other, but are formed in the same manufacture process as that of the wiring layer 10 of FIG. 3. Additionally, when a gap position between the wiring layers 6 and 80 or between the wiring layers 80 and 8 vertically overlaps the gap position between the upper wiring layers 10a and 10b, the external light possibly enters the electric charge transfer area 12, and the like. Therefore, it is preferable to form the wiring layers 6, 80, 8, 10a, 10b so as not to overlap these gaps.

Moreover, a shielding film 15 is formed above the wiring layers 10a, 10b so that prevent the external light is not entered from between the wiring layers 10a and 10b. When the shielding film 15 is formed using a material with a low reflectance, the irregularly reflected light advancing between the shielding film 15 and the wiring layers 10a, 10b can efficiently be cut off.

As described above, in the second embodiment, since the groove-shaped contact holes 7a, 9a, 13, 14 are formed in upper and lower stages, no external light enters from between the wiring layers 6 and 10a or between the wiring layers 8 and 10b. Because of this, the second embodiment is more subject to the external light than the first embodiment.

Additionally, the contact holes 13, 14 may be discontinued in some portions. Moreover, either one of the contact holes 7a, 9a may be omitted. Furthermore, either one of the contact holes 13, 14 may be omitted.

Moreover, instead of forming the strip-shaped contacts 7a, 9a, 13, 14 in the upper and lower stages as shown in FIG. 8, the contact holes 13, 14 may be formed only between the upper wiring layers 10a, 10b and the wiring layers 6, 8 as shown in FIG. 9A. Alternatively, contrary to FIG. 9A, the contact holes 7a, 9a may be formed only between the lower wiring layers 2b, 33 and the wiring layers 6, 8.

Furthermore, as shown in FIG. 9B, the wiring layers (6, 8), (10a, 10b), (40a, 40b) may vertically be formed in three or more layers. In the example of FIG. 9B, the wiring layers (6, 10a), (8, 10b), (10a, 40a), (10b, 40b) vertically adjacent to each other via the insulating layer are connected via the strip-shaped contacts 13, 14, 41, 42 along the electric charge transfer direction of the CCD register.

In FIG. 9B, the vertically adjacent wiring layers are connected via the strip-shaped contacts, but only some sets of wiring layers may be connected via the strip-shaped contacts. Moreover, as shown in FIG. 8, the transfer electrodes 2b, 33 may be connected to the wiring layers 6, 8 via the strip-shaped contact.

Third Embodiment

As shown in FIGS. 4 and 7, when the groove-shaped contact hole 7a is formed on the shift electrode 2b, the threshold value voltage of the channel area 11 under the shift electrode 2b changes, and there is a possibility that an operation defect occurs. A third embodiment has a feature in which it is possible to prevent a fluctuation of threshold value voltage.

Figure 10:
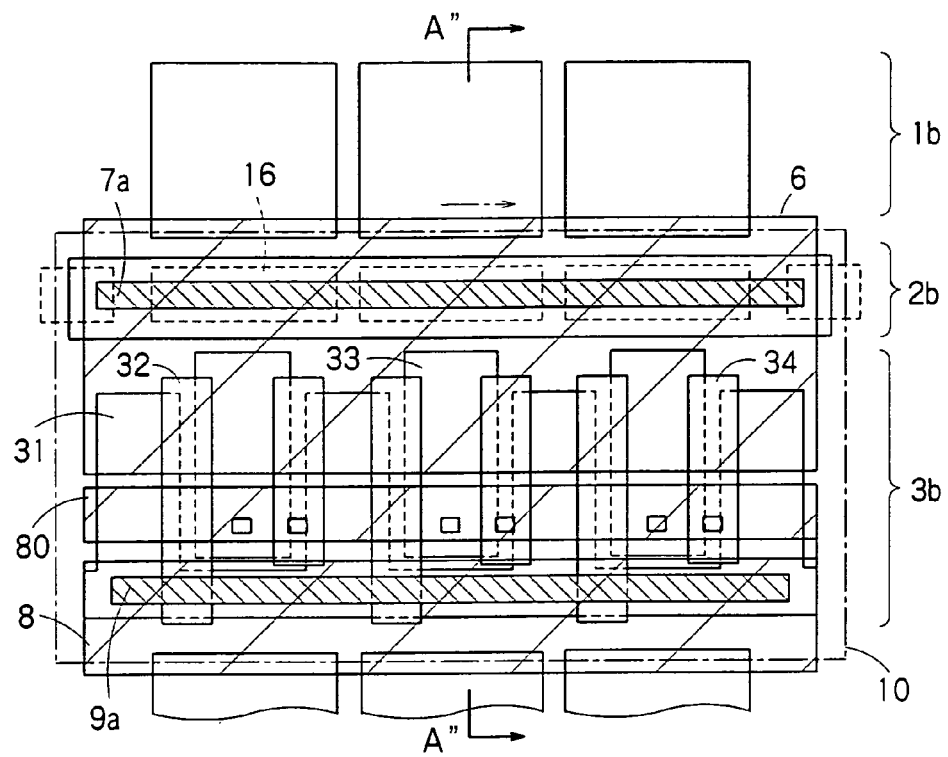
FIG. 10 is a plan view of a third embodiment of the image sensor.
Figure 11:
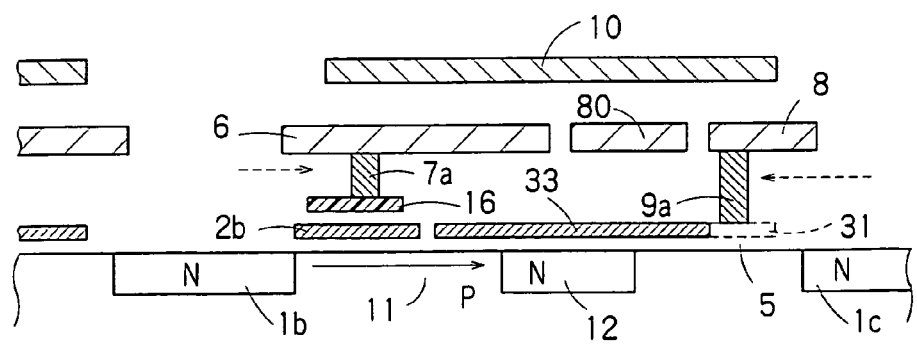
FIG. 11 is a sectional view along line A"—A" of FIG. 10.

FIG. 10 is a plan view of the third embodiment of the image sensor, and FIG. 11 is a sectional view along line A"—A" of FIG. 10. In FIGS. 10 and 11, the constituting parts common to those of FIGS. 4 and 5 are denoted with the same numerals.

In the image sensor of FIGS. 10 and 11, a polysilicon layer (conductive layer) 16 is formed above the shift electrode 2b via the insulating layer, for example, in the same manufacture process as that of the transfer electrodes 32, 34. The polysilicon layer 16 and the wiring layer 6 thereabove are connected via the groove-shaped contact hole 7a extended in the longitudinal direction of the shift electrode 2b. Here, as shown by a dotted line in FIG. 10, the polysilicon layer 16 has a length substantially equal to the width of the channel area 11, and two adjacent polysilicon layers 16 are separated by the insulating layer. Therefore, the shift electrode 2b and the wiring layer 6 are connected in the contact hole formed in the gap position between two adjacent polysilicon layers 16.

Moreover, the transfer electrodes 31, 32 of the CCD register 3b are connected to the wiring layer 8 via the groove-shaped contact hole 9a extended along the longitudinal direction (electric charge transfer direction) of the CCD register 3b in a similar manner as FIG. 5. The contact holes 7a, 9a are filled with the conductive materials such as aluminum.

In the image sensor of FIGS. 10 and 11, since the groove-shaped contact hole 7a is formed on the top surface of the polysilicon layer 16 above the shift electrode 2b, instead of being formed directly on the top surface of the shift electrode 2b above the channel area 11, the threshold voltage of the channel area 11 under the shift electrode 2b does not fluctuate. Moreover, since the external light incident between the shift electrode 2b and the wiring layer 6 is cut off by the contact by the contact hole 7a between the polysilicon layer 16 and the wiring layer 6 above the shift electrode 2b, the effect similar to that of the first and second embodiments can be obtained.

The present invention can also be applied to the contacts other than those of the above-described embodiments. For example, FIG. 12 is a sectional view showing an example in which a predetermined voltage is applied to a diffusion area (p-type area) between the pixel string 1c and the CCD register 3b in order to suppress the potential fluctuation of the substrate.

As shown in FIG. 12, a sixth contact 92 is formed on the top surface of a p-type area 91 in the substrate, and a sixth wiring layer 93 is formed on the top surface of the contact. When the sixth contact 92 is formed in a strip shape substantially parallel to the longitudinal direction (electric charge transfer direction) of the CCD register 3b similarly to FIG. 4, the shielding effect can be obtained similarly to the above-described embodiments.

On the other hand, FIG. 13 is a sectional view showing an example in which an electric discharge gate is disposed for discharging the electric charge of the pixel string 1c. As shown in FIG. 13, an electric discharge gate 101 is formed above the substrate between the pixel string 1c and a drain area 104 for discharging the electric charge of the pixel string 1c via the insulating layer 5, a seventh contact 102 is formed on the top surface of the electric discharge gate 101, and a seventh wiring layer 103 is formed on the top surface of the contact. By applying the predetermined voltage to the seventh wiring layer 103, the electric charge accumulated in the pixel string 1c can be discharged to the side of the drain area 104, and an electronic shutter function can be realized.

Also in FIG. 13, by forming the seventh contact 102 in a strip shape in the longitudinal direction (a direction crossing substantially at right angles to an electric discharge direction under the electric discharge gate 101) of the electric discharge gate 101 similarly to FIG. 4, the shielding effect can be obtained.

Figure 14:
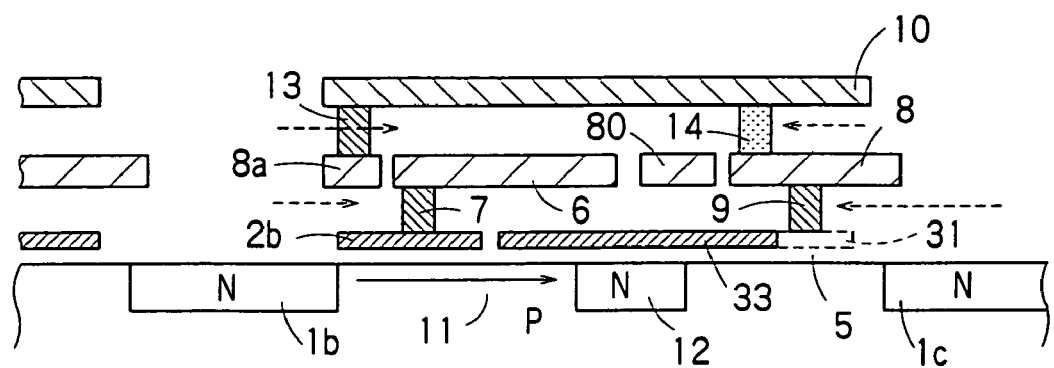
FIG. 14 is a sectional view showing an example in which a strip-shaped contact is formed for purposes other than the purpose of wiring the transfer electrode.

The example in which there is a gap between the wiring layers 10a and 10b on the upper side (second layer) has been described with reference to FIGS. 7 and 8, but the gap may be eliminated. For example, FIG. 14 is a sectional view showing an example in which there is no gap in a second wiring layer 10, the wiring layer 8a is formed in the first-layer wiring area for purposes other than the purpose of wiring the transfer electrodes 31 to 34 of the CCD register 3b, and the wiring layer 8a is connected to the wiring layer 10 via the contact 13 extended like a strip in the electric charge transfer direction of the CCD register 3b.

Also in this case, the external light can be cut off by the first-layer contacts 7a, 9a and second-layer contacts 13, 14.

As described above, the strip-shaped contact may be formed for purposes other than the purpose of wiring the transfer electrodes 31 to 34.

What is claimed is:

1. A solid image pickup apparatus comprising:
    a pixel string in which a plurality of photoelectric converting sections corresponding to pixels are arranged in one string;
    a CCD register, adjacently arranged to said pixel string, for successively transferring, in a predetermined direction, signal charges photoelectrically converted in the respective photoelectric converting sections;
    a transfer electrode for supplying a voltage for transferring to said CCD register;
    n (n is an integer of two or more) pieces of wiring layers formed in lamellar shape above said transfer electrode and its periphery via an insulating layer; and
    a contact having a length longer than a width of one pixel along an electric charge transfer direction of said CCD register to at least one location between the transfer electrode and the wiring layer and between two wiring layers vertically adjacent to each other via said insulating layer.

2. The solid image pickup apparatus according to claim 1 wherein said wiring layer is disposed to apply a voltage to at least one of the transfer electrode of said CCD register, an electrode other than the electrode of said CCD register, and a semiconductor area.

3. The solid image pickup apparatus according to claim 1 further comprising:
    a shift electrode formed between said pixel string and said CCD register, said shift electrode transferring to said CCD register the signal charge photoelectrically converted by the photoelectric converting section in said pixel string;
    a shift electrode wiring layer for applying a voltage for transferring electric charge to said shift electrode; and
    a contact which is formed into the strip shape along a direction crossing substantially at right angles to electric charge transfer direction under said shift electrode and which connects said shift electrode to said shift electrode wiring layer.

4. The solid image pickup apparatus according to claim 3 further comprising:
    an upper-stage wiring layer formed above said shift electrode wiring layer via the insulating layer; and
    a contact which is formed into a strip shape along the electric charge transfer direction of said CCD register or along a direction crossing substantially at right angles to electric charge transfer direction under said shift electrode and which connects said shift electrode wiring layer to said upper-stage wiring layer.

5. The solid image pickup apparatus according to claim 4 wherein said upper-stage wiring layer is formed of a polysilicon layer.

6. The solid image pickup apparatus according to claim 1 further comprising:
    a first wiring layer for applying a voltage for transferring electric charge to the transfer electrode of said CCD register;

a first contact which is formed into a strip shape along the electric charge transfer direction of said CCD register and which connects said transfer electrode to said first wiring layer;

a shift electrode which is formed between said pixel string and said CCD register and which transfers the signal charges photoelectrically converted in the photoelectric converting sections in said pixel string to said CCD register;

a second wiring layer for applying the voltage for transferring electric charge to said shift electrode;

a second contact which is formed into a strip shape along a direction crossing substantially at right angles to electric charge transfer direction under said shift electrode and which connects said shift electrode to said second wiring layer;

a third wiring layer formed above said first wiring layer via the insulating layer;

a third contact which is formed into the strip shape along the electric charge transfer direction of said CCD register and which connects said first wiring layer to said third wiring layer;

a fourth wiring layer formed above said second wiring layer via the insulating layer;

a fourth contact which is formed into the strip shape along a direction crossing substantially at right angles to electric charge transfer direction under said shift electrode and which connects said second wiring layer to said fourth wiring layer; and a shielding film formed above said third and fourth wiring layers via the insulating layer.

7. The solid image pickup apparatus according to claim 1 wherein each of the wiring layers is formed so that at least two of the wiring layers does not overlap in a vertical direction when each of the wiring layers has a gap.

8. The solid image pickup apparatus according to claim 1 wherein:

said CCD register comprises a first transfer electrode to which a first voltage is applied, and a second transfer electrode to which a second voltage is applied, the voltage for transferring electric charge is applied to said first transfer electrode from a first wiring layer, the voltage for transferring electric charge is applied to said second transfer electrode from a fifth wiring layer, said first transfer electrode is connected to said first wiring layer via a first contact formed into a strip shape along the electric charge transfer direction of said CCD register, and said second transfer electrode is connected to said fifth wiring layer via a plurality of contacts formed at predetermined intervals.

9. The solid image pickup apparatus according to claim 1 further comprising:

a diffusion area formed adjacent to said CCD register;

a substrate wiring layer for applying a predetermined voltage to a substrate through said diffusion area; and a contact which is formed into a strip shape along the electric charge transfer direction of said CCD register and which connects said diffusion area to said substrate wiring layer.

10. The solid image pickup apparatus according to claim 1 further comprising:

an electric discharge gate, disposed in parallel with said pixel string, for discharging the signal charge photoelectrically converted in said photoelectric converting section;

a discharge wiring layer for applying an electric discharging voltage to said electric discharge gate; and a contact which is formed into a strip shape along a direction crossing substantially at right angles to an electric discharge direction in said electric discharge gate and which connects said electric discharge gate to said discharge wiring layer.

11. The solid image pickup apparatus according to claim 1 further comprising:

a shift electrode, formed between said pixel string and said CCD register, for transferring the signal charges photoelectrically converted in the respective photoelectric converting sections in said pixel string to said CCD register;

a first wiring layer for applying the voltage for transferring electric charge to said shift electrode;

a second wiring layer formed above said first wiring layer via the insulating layer; and a contact which is formed into a strip shape along the electric charge transfer direction of said CCD register and which connects said first wiring layer to said second wiring layer.

12. A solid image pickup apparatus comprising:

a pixel string in which a plurality of photoelectric converting sections corresponding to pixels are arranged in one string;

a CCD register, adjacently arranged to said pixel string, for successively transferring, in a predetermined direction, signal charges photoelectrically converted in the respective photoelectric converting sections;

n (n is an integer of two or more) pieces of wiring layers formed in lamellar shape above said CCD register and its periphery via an insulating layer; and a contact having a length longer than a width of one pixel along an electric charge transfer direction of said CCD register in at least one location between two wiring layers vertically adjacent to each other via said insulating layer.

13. The solid image pickup apparatus according to claim 12 wherein said wiring layer is disposed to apply a voltage to at least one of the transfer electrode of said CCD register, an electrode other than the electrode of said CCD register, and a semiconductor area.

14. The solid image pickup apparatus according to claim 12 further comprising:

a shift electrode formed between said pixel string and said CCD register, said shift electrode transferring to said CCD register the signal charge photoelectrically converted by the photoelectric converting section in said pixel string;

a shift electrode wiring layer for applying a voltage for transferring electric charge to said shift electrode; and a contact which is formed into the strip shape along a direction crossing substantially at right angles to electric charge transfer direction under said shift electrode and which connects said shift electrode to said shift electrode wiring layer.

15. The solid image pickup apparatus according to claim 14 further comprising:

an upper-stage wiring layer formed above said shift electrode wiring layer via the insulating layer; and a contact which is formed into a strip shape along the electric charge transfer direction of said CCD register or along a direction crossing substantially at right angles to electric charge transfer direction under said shift electrode and which connects said shift electrode wiring layer to said upper-stage wiring layer.

16. The solid image pickup apparatus according to claim 15 wherein said upper-stage wiring layer is formed of a polysilicon layer.

17. The solid image pickup apparatus according to claim 12 wherein each of the wiring layers is formed so that at least two of the wiring layers does not overlap in a vertical direction when each of the wiring layers has a gap.

18. The solid image pickup apparatus according to claim 12 further comprising:
a diffusion area formed adjacent to said CCD register;
a substrate wiring layer for applying a predetermined voltage to a substrate through said diffusion area; and
a contact which is formed into a strip shape along the electric charge transfer direction of said CCD register and which connects said diffusion area to said substrate wiring layer.

19. The solid image pickup apparatus according to claim 12 further comprising:
an electric discharge gate, disposed in parallel with said pixel string, for discharging the signal charge photoelectrically converted in said photoelectric converting section;
a discharge wiring layer for applying an electric discharging voltage to said electric discharge gate; and
a contact which is formed into a strip shape along a direction crossing substantially at right angles to an electric discharge direction in said electric discharge gate and which connects said electric discharge gate to said discharge wiring layer.

20. The solid image pickup apparatus according to claim 12 further comprising:
a shift electrode formed between said pixel string and said CCD register for transferring the signal charges photoelectric converted in the respective photoelectric converting sections in said pixel string to said CCD register;
a first wiring layer for applying the voltage for transferring electric charge to said shift electrode;
a second wiring layer formed above said first wiring layer via the insulating layer; and
a contact, formed into a strip shape along the electric charge transfer direction of said CCD register, for connecting said first wiring layer to said second wiring layer.

21. A solid image pickup apparatus comprising:
a pixel string in which a plurality of photoelectric converting sections corresponding to pixels are arranged in one string;
a CCD register, adjacently arranged to said pixel string, for successively transferring, in a predetermined direction, signal charges photoelectrically converting in the respective photoelectric converting sections;
a wiring layer formed above said CCD register and it periphery via an insulating layer;
a shift electrode which is formed between said pixel string and said CCD register and which transfers, to said CCD register, the signal charges photoelectrically converted in the respective photoelectric converting sections in said pixel string;
a shift electrode wiring layer for applying a voltage for transferring electric charge to said shift electrode; and
a contact which has a length longer than a width of one pixel along a direction crossing substantially at right angles an electric charge transfer direction under said shift electrode and which connects said shift electrode to said shift electrode wiring layer.

22. The solid image pickup apparatus according to claim 21 further comprising:
an upper-stage wiring layer formed above said shift electrode wiring layer via the insulating layer; and
a contact which is formed into the strip shape along the electric charge transfer direction of said CCD register or along a direction crossing substantially at right angles to electric charge transfer direction under said shift electrode and which connects said shift electrode wiring layer to said upper-stage wiring layer.

23. The solid image pickup apparatus according to claim 22 wherein said upper-stage wiring layer is formed of a polysilicon layer.

24. A solid image pickup apparatus comprising:
a pixel string in which a plurality of photoelectric converting sections corresponding to pixels are arranged in one string;
a CCD register, adjacently arranged to said pixel string, for successively transferring, in a predetermined direction, signal charges photoelectrically converted in the respective photoelectric converting sections;
a wiring layer formed above said CCD register and its periphery via an insulating layer;
a first contact having a length longer than a width of one pixel along an electric charge transfer direction of said CCD register and connected to said wiring layer;
a shift electrode which is formed between said pixel string and said CCD register and which transfers, to said CCD register, the signal charges photoelectrically converted in the respective photoelectric converting sections in said pixel string;
a shift electrode wiring layer for applying a voltage for transferring electric charge to said shift electrode;
a second contact which is formed into a strip shape along a direction crossing substantially at right angles to electric charge transfer direction under said shift electrode and which connects said shift electrode to said shift electrode wiring layer;
a conductive layer intermittently formed above said shift electrode via the insulating layer;
a wiring layer formed above said conductive layer via the insulating layer; and
a third contact which is formed into a strip shape along a direction crossing substantially at right angles to electric charge transfer direction under said shift electrode and which connects said shift electrode to said wiring layer at a gap position of said conductive layer.

25. A solid image pickup apparatus comprising:
a pixel string in which a plurality of photoelectric converting sections corresponding to pixels are arranged in one string;
a CCD register, adjacently arranged to said pixel string, for successively transferring, in a predetermined direction, signal charges photoelectrically converted in the respective photoelectric converting sections;
a wiring layer formed above said CCD register and its periphery via an insulating layer;
a first contact having a length longer than a width of one pixel along an electric charge transfer direction of said CCD register and connected to said wiring layer;
a shift electrode, formed between said pixel string and said CCD register, for transferring the signal charges photoelectrically converted in the photoelectric converting sections in said pixel string to said CCD register;

a first wiring layer for applying the voltage for transferring electric charge to said shift electrode;

a second wiring layer formed above said first wiring layer via the insulating layer; and a second contact which is formed into a strip shape along the electric charge transfer direction of said CCD register and which connects said first wiring layer to said second wiring layer.

* * * * *

UNITED STATES PATENT AND TRADEMARK OFFICE
CERTIFICATE OF CORRECTION

| | | |
|---|---|---|
| PATENT NO. | : 7,116,369 B1 | Page 1 of 1 |
| APPLICATION NO. | : 09/497154 | |
| DATED | : October 3, 2006 | |
| INVENTOR(S) | : Monoi | |

It is certified that error appears in the above-identified patent and that said Letters Patent is hereby corrected as shown below:

On the title page, Item (54), and Column 1, the Title information is incorrect. Item (54) and Column 1 should read:

-- SOLID IMAGE PICKUP APPARATUS --

Signed and Sealed this

Third Day of July, 2007

JON W. DUDAS
*Director of the United States Patent and Trademark Office*